United States Patent
Hasegawa et al.

(10) Patent No.: US 7,654,815 B2
(45) Date of Patent: Feb. 2, 2010

(54) BELT-SHAPED MOLD AND NANOIMPRINT SYSTEM USING THE BELT-SHAPED MOLD

(75) Inventors: Mitsuru Hasegawa, Hitachi (JP); Masahiko Ogino, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/191,326

(22) Filed: Aug. 14, 2008

(65) Prior Publication Data

US 2009/0087506 A1 Apr. 2, 2009

(30) Foreign Application Priority Data

Sep. 27, 2007 (JP) ............................. 2007-251415

(51) Int. Cl.
*B29C 59/04* (2006.01)

(52) U.S. Cl. ...................... 425/363; 425/373; 425/385; 425/471; 977/887

(58) Field of Classification Search ................. 425/363, 425/373, 385, 471; 977/887
See application file for complete search history.

(56) References Cited

U.S. PATENT DOCUMENTS

| | | | | |
|---|---|---|---|---|
| 3,874,836 A | * | 4/1975 | Johnson et al. | ............. 425/363 |
| 5,259,926 A | | 11/1993 | Kuwabara et al. | |
| 5,368,789 A | * | 11/1994 | Kamitakahara et al. | ..... 425/385 |
| 5,527,497 A | * | 6/1996 | Kanome et al. | ............. 425/385 |
| 5,772,905 A | | 6/1998 | Chou | |
| 7,520,742 B2 | * | 4/2009 | Motowaki et al. | ........... 425/385 |

FOREIGN PATENT DOCUMENTS

JP 2006-326948 12/2006

OTHER PUBLICATIONS

S. Y. Chou et. al., "Imprint of sub-25 nm vias and trenches in polymers", Appl. Phys. Lett., vol. 67, p. 3114 (Nov. 1995).
Hua Tan et al., "Roller nanoimprint lithography", J. Vac. Sci. Technol., B16(6), p. 3926 (Nov. 1998).

* cited by examiner

*Primary Examiner*—James Mackey
(74) *Attorney, Agent, or Firm*—Antonelli, Terry, Stout & Kraus, LLP.

(57) ABSTRACT

There is provided a fine pattern transfer, belt-shaped mold, with which a fine structure having a high aspect ratio can be formed rapidly and stably using nanoimprinting, and a fine pattern transfer system (a nanoimprint system) that employs this mold. According to the present invention, a nanoimprint mold includes: a belt-shaped support member; a plurality of stampers, for each of which a fine convex-and-concave pattern, to be transferred, is formed on one surface; and an adhesive member, to which the belt-shaped support member and the stampers are to be securely adhered, wherein the adhesive member includes a porous member and adhesive layers, which are deposited on either face of the porous member, for impregnating one part of the porous member, and wherein, for the porous member, a porous area that is not impregnated with the adhesive layers, is provided and positioned so as to sandwich the porous member between portions impregnated with the adhesive layers.

15 Claims, 11 Drawing Sheets

BELT-SHAPED MOLD AND NANOIMPRINT SYSTEM USING THE BELT-SHAPED MOLD

BACKGROUND OF THE INVENTION (1) Field of the Invention

The present invention relates to a pattern transfer mold and to a transfer system for employing the pattern transfer mold, and relates particularly to a fine structure transfer mold, with which the nanoimprinting transfer of a fine pattern can be performed very accurately, at a low cost, and a fine structure transfer system for employing this mold.

(2) Description of Related Art

Conventionally, photolithography technology is employed for processing fine patterns required for semiconductor integrated circuits. However, in consonance with developments in the structural refinement and the integration of circuits, required element sizes have been reduced until they are the equivalent of the wavelengths of light sources used for photolithography exposure, and fabricating such fine patterns using photolithography is difficult. Therefore, instead of a system that employs photolithography, one that uses electron beam lithography, a type of charged particle beam lithography, has begun to be employed.

For the formation of a pattern using an electron beam, employed is a direct writing method, for which a light source such as an i-line (a type of ultraviolet ray) or an excimer laser is used, that differs greatly from the conventional full projection method. However, a fundamental disadvantage of the direct writing method is that whereas the time required to complete one pattern is normally not excessive, to complete a number of patterns an extended period is required, since the time needed would be a multiple of that for a single pattern. Thus, as the level of integration for semiconductor integrated circuits has been increased, throughput has been reduced, which has led to the development of a full pattern irradiation method, whereby, to increase the speed of the electron beam lithography system, variously shaped masks are employed together and are collectively irradiated by an electron beam to form a mask pattern having a complicated shape. However, with this system, when the situation is such that the refinement of patterns is continuous, associated system costs rise, i.e., the size of the electron beam lithography system is increased and accurate control means, for positioning the masks, must be provided.

On the other hand, a technique for the low cost forming of a fine pattern is disclosed, for example, in U.S. Pat. Nos. A1-5,259,926 and A1-5,772,905 and in "S. Y. Chou et. al., Appl. Phys. Lett., vol. 67, p. 3114 (1995)". According to this technique, a stamper is used to emboss a resist layer, deposited on the surface of a substrate, with a desired, but inverted, fine, convex-and-concave pattern to be formed on the substrate. As a result, the desired fine pattern can be transferred to the substrate, which, especially according to the nanoimprint technique described in U.S. Pat. No. A1-5,772,905 or "S. Y. Chou et. al., Appl. Phys. Lett., vol. 67, p. 3114 (1995)", is a silicon wafer, to be employed as a mold, to which and on which a fine, 25 nanometer or smaller structure can be transferred and collectively formed.

Further, the following imprinting method is described in U.S. Pat. No. A1-5,772,905 and "S. Y. Chou et. al., Appl. Phys. Lett., vol. 67, p. 3114 (1995)". According to this method, a mold is placed on a substrate on which a resin coat has been deposited, and the substrate is mounted on the stage of a parallel plate pressing system, which pressurizes and heats the substrate at the glass transition temperature for the resin, or higher. Then, the substrate is cooled at the glass transition temperature, or lower, and is released from the mold to complete the pattern transfer process.

Furthermore, an imprinting method that employs a roller to apply pressure is disclosed in "Hua Tan et al., J. Vac. Sci. Technol., B16(6), p. 3926 (1998)". According to this document, a mold is mounted around a roller and is used to imprint a fine pattern having a width of 700 nm and a height of 60 nm. Also in the description given in "Hua Tan et al., J. Vac. Sci. Technol., B16(6), p. 3926 (1998)", a roller is used to apply pressure to a flat plate mold to form a fine pattern line 70 nm wide and 40 nm long.

However, the following problem has been identified for the above described nanoimprint technique for accurately forming a fine pattern. For example, when the method described in U.S. Pat. No. A1-5,772,905 and "S. Y. Chou et. al., Appl. Phys. Lett., vol. 67, p. 3114 (1995)" is employed to imprint a pattern on a substrate, the heating, pressure application, cooling and release processes must be sequentially performed. Therefore, an extended period of time is required for one pattern imprinting cycle, and it is difficult for this method to be employed for the mass production of a fine structure. As for the method described in "Hua Tan et al., J. Vac. Sci. Technol., B16(6), p. 3926 (1998)", the substrate is released (separated) from the mold immediately after the substrate has been heated and the pattern imprinted on the substrate. Thus, the aspect ratio (the pattern height/the pattern width) for a pattern to be imprinted tends to be low, e.g., 0.086 (60 nm/700 nm) or 0.57 (40 nm/70 nm), and it is difficult to use this method for a device, such as an optical device or a bio-device, that requires a fine structure having a high aspect ratio (e.g., an aspect ratio of 1 or greater).

As a measure for resolving these problems, a nanoimprint technique is proposed that employs a long belt mold on which a fine pattern has been formed (e.g., JP-A-2006-326948). According to this method, since the heating, pressure application, cooling and releasing processes for the pattern transfer can be sequentially performed, a pattern having a high aspect ratio can be rapidly transferred.

Generally, a semiconductor processing technique is required to form a fine pattern for which the size is several or fewer μm. However, at present, since the maximum diameter of a sample wafer to be processed is substantially 300 mm, it is difficult for a fine pattern to be directly formed on a long, large dimension belt-shaped mold. Therefore, there is a common request for a method whereby a long, highly reproducible belt-shaped mold, used for transferring a fine pattern, can be stably manufactured, i.e., for the provision of a long, belt-shaped mold, with which a fine structure having a high aspect ratio can be rapidly and stably formed (while the abnormal deformation or the snapping of a material, to which a pattern is to be transferred, is prevented).

BRIEF SUMMARY OF THE INVENTION

Therefore, to resolve the above described shortcomings, one objective of the present invention is to provide a fine pattern transfer, belt-shaped mold, with which a fine structure having a high aspect ratio can formed rapidly and stably using nanoimprinting, and a fine pattern transfer system (a nanoimprint system) that employs this mold.

To achieve this objective, according to the present invention, a nanoimprint mold comprises:

a belt-shaped support member;

a plurality of stampers, for each of which a fine convex-and-concave pattern, to be transferred, is formed on one surface; and an adhesive member, to which the belt-shaped support member and the stampers are to be securely adhered, wherein the adhesive member includes a porous member and adhesive layers, which are deposited on either face of the porous member, for impregnating one part of the porous member, and wherein, for the porous member, a porous area that is not impregnated with the adhesive layers, is provided and positioned so as to sandwich the porous member between portions impregnated with the adhesive layers.

Furthermore, to achieve this objective, according to the present invention, a nanoimprint mold comprises:

a belt-shaped support member;

a plurality of stampers, for each of which a fine convex-and-concave pattern, to be transferred, is formed on one surface; and an adhesive member, to which the belt-shaped support member and the stampers are to be securely adhered, wherein the adhesive member includes a porous member and adhesive layers, which are deposited on either face of the porous member, for impregnating one part of the porous member, wherein, for the porous member, a porous area that is not impregnated with the adhesive layers, is provided and positioned so the porous member is sandwiched between portions impregnated with the adhesive layers, and wherein, viewed in a direction parallel to a plane along which the adhesive member and the stampers are adhered, portions of the belt-shaped mold corresponding to the ends of the stampers are thinner than portions of the belt-shaped mold at locations corresponding to the centers of the stampers.

Further, in order to achieve the objective, according to the preset invention, a nanoimprint system comprises:

the above described belt-shaped mold;

a belt-shaped mold drive mechanism for rotating the belt-shaped mold;

a conveying mechanism for conveying a transfer targeted member, to which a fine, convex-and-concave pattern, formed on stamper surfaces, is to be transferred; and a pattern transfer mechanism for gripping the belt-shaped mold and the transfer targeted member, and for transferring the fine, convex-and-concave pattern from the stamper surfaces to the surface of the transfer targeted member.

According to the present invention, the belt-shaped mold and the nanoimprint system, whereby the heating, pressure application, cooling and release (separation) processes are sequentially performed and can be parallel provided, for transferring a pattern to a transfer targeted sheet. Thus, a sheet product whereon a fine pattern, having a high aspect ratio, is imprinted can be efficiently produced and a high throughput obtained.

Thus, it is preferable that the following improvements or alterations be provided for the present invention.

(1) Coupling of the stampers to the outer wall of the belt-shaped support member so that the fine, convex-and-concave pattern faces outward.

(2) Forming the porous member, which is used as the adhesive member, of an air permeable material.

(3) Forming the porous member, which forms the adhesive member, of a resin such as PTFE (polytetrafluoroethylene).

(4) Forming the adhesive layers, used to form the adhesive members, of thermosetting resins.

(5) Varying the thicknesses of adhesive layers on either side of an adhesive member, and ensuring that, when the adhesive member faces to which the belt-shaped support member and the stamper are secured, the adhesive layer adhered to the face that has a roughness average Ra greater than the other face is thicker than the adhesive layer that is adhered to the other face.

(6) Preparing a projection plane, for the face to which the stampers are adhered, that is smaller than is the face to which the adhesive member is adhered.

(7) Assuring that viewed in a direction parallel to the plane along which the stampers are adhered to the adhesive member, at locations corresponding to the ends of the stampers, the thickness of the adhesive member is smaller than the thickness of the adhesive member at locations corresponding to the centers of the stampers.

(8) Assuring that viewed in a direction parallel to the plane where the stampers are adhered to the adhesive member, the thickness at the ends of the stampers is smaller than the thickness at the centers of the stampers.

(9) Assuring that viewed in a direction parallel to the plane where the stampers are adhered to the adhesive member, the end areas of the stampers are tapered in cross section.

(10) Preparing a resin to fill the gaps between adjacent stampers that are arranged along the surface of a belt-shaped support member.

(11) Producing a tape-like material to be applied to the surfaces of stampers, adjacent to gaps between the stampers arranged along the surface of the belt-shaped support member, to pass over and cover the gaps.

Other objects, features and advantages of the invention will become apparent from the following description of the embodiments of the invention taken in conjunction with the accompanying drawings.

DETAILED DESCRIPTION OF THE INVENTION

Embodiments according to the present invention will now be described while referring to the accompanying drawings. However, the present invention is not limited to the following embodiments, and may be carried out by appropriately combining these embodiments.

Embodiment 1

Figure 1A:
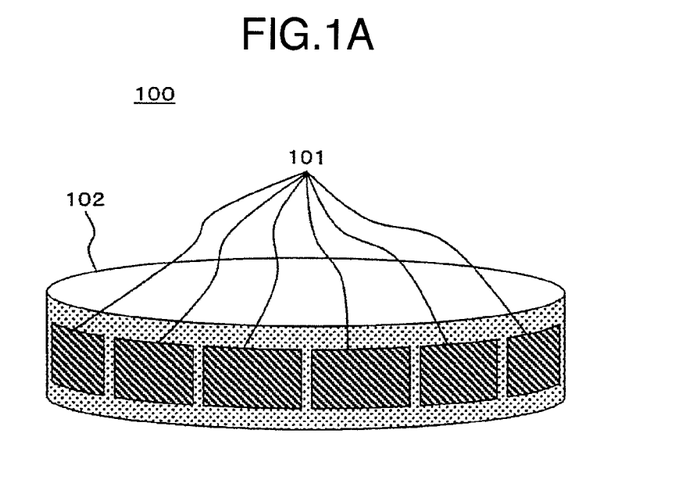
FIGS. 1A to 1C are schematic diagrams illustrating a belt-shaped mold according to a first embodiment of the present invention.
Figure 1B:
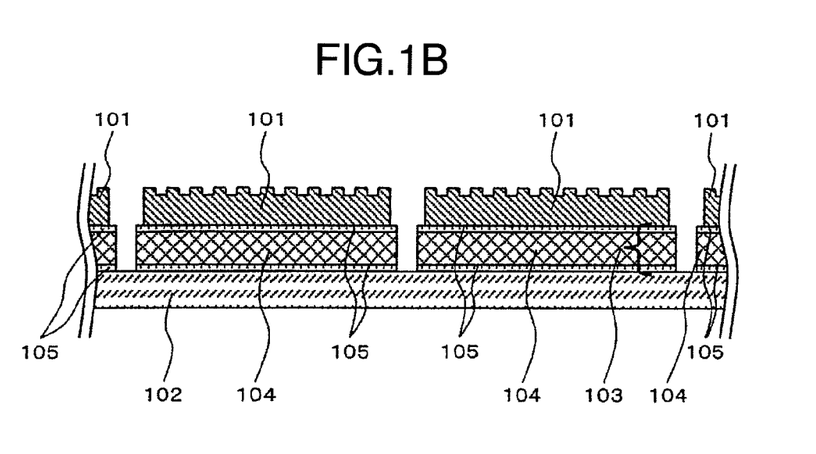
Figure 1C:
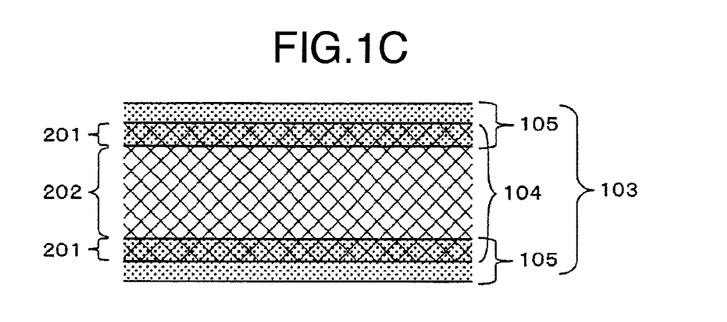

FIGS. 1A to 1C are schematic diagrams illustrating a belt-shaped mold according to a first embodiment of the present invention. Specifically, FIG. 1A is an overall perspective of a belt-shaped mold 100, FIG. 1B is a schematic cross-sectional view of the structure of the belt-shaped mold 100, and FIG. 1C is a schematic cross-sectional view of an adhesive member. For the belt-shaped mold 100, a plurality of stampers 100 having fine, convex-and-concave patterns are arranged along one surface of an endless belt 102. As shown in FIG. 1B, an adhesive member 103 is provided by depositing a layer, made of a thermosetting resin 105, on the obverse and reverse sides of a porous member 104, and is located between the stampers 101 and the endless belt 102. The stampers 101 and the endless belt 102 are fixed by being adhered to the thermosetting resin 105 layers on the obverse and reverse of the adhesive member 103. As shown in FIG. 1C, pores are contiguously formed inside the porous member 104, i.e., the porous member 104 is air permeable, and impregnated areas 201, wherein the thermosetting resin 105 is used to impregnate the pores in the vicinity of the area wherein the porous member 104 contacts the thermosetting resin 105. In addition, porous areas 202 wherein the remaining pores are present are sandwiched between the impregnated areas 201 located on either side of the porous member 104.

A method for manufacturing the belt-shaped mold 100 for the first embodiment of the present invention will now be described while referring to FIGS. 2A to 2D. FIGS. 2A to 2D are schematic cross-sectional views of an overview of the belt-shaped mold manufacturing processing according to the first embodiment of the invention.

Figure 2A:
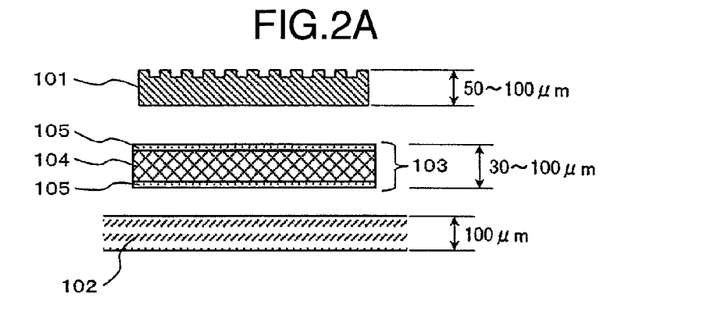
FIGS. 2A to 2D are schematic cross-sectional views of an overview of the processing performed to manufacture the belt-shaped mold of the present invention.

First, the individual members as illustrated in FIG. 2A are prepared. The stampers 101, for example, are obtained in the following manner. A desired fine, convex-and-concave pattern is processed on the surface, for example, of a silicon or silica substrate that can be subjected to semiconductor processing, and the obtained substrate is employed as a master for a stamper. Then, Ni plating, for example, is applied to the surface of the master, and the Ni plated foil (having, for example, a thickness of about 50 to 100 μm) is released from the master and is employed as the stamper 101. The endless belt 102 can be manufactured, for example, by welding the originating end and the terminal end of a stainless, thin belt plate (having, for example, a thickness of about 100 μm). The adhesive member 103 can be obtained, for example, by depositing the thermosetting resin 105 (epoxy resin, for example, having a thickness of about 30 μm) on both faces of a sheet made of the polytetrafluoroethylene porous member 14 (having, for example, a thickness of about 30 to 100 μm).

Figure 2B:
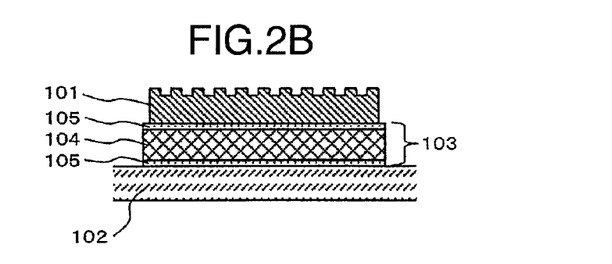
Figure 2C:
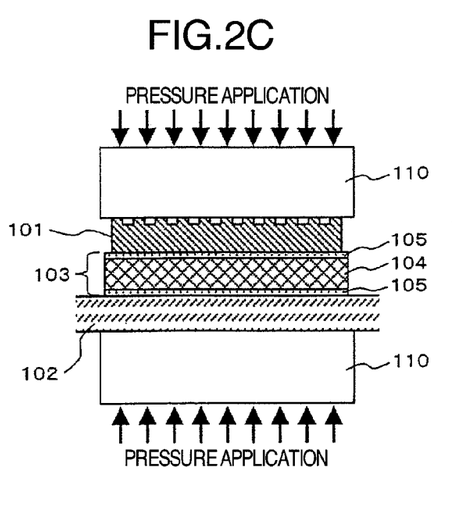
Figure 2D:
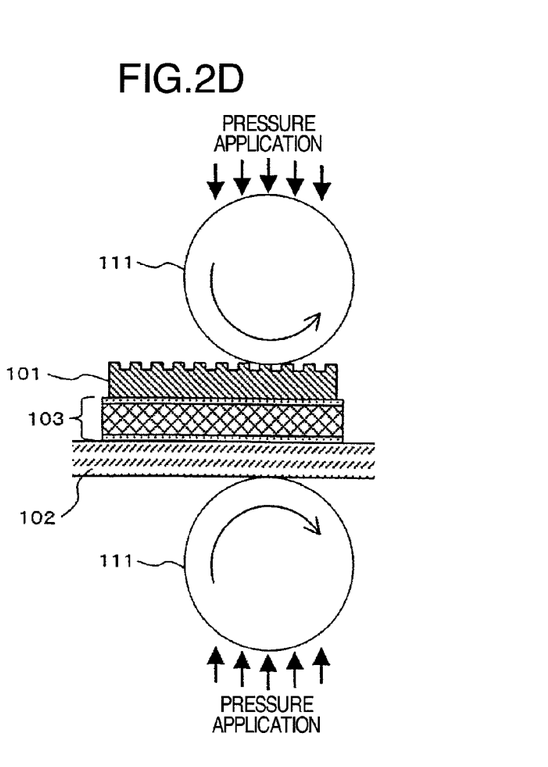

Following this, the adhesive member 103 and the stampers 101 are laminated on the surface of the endless belt 102 (FIG. 2B). Thereafter, pressure is applied to these laminated members by a pressing mechanism 110, at a temperature such that the thermosetting resin 105 becomes soft and melts, but does not become hard. Thus, the stampers 101, the adhesive member 103 and the endless belt 102 are thermally bonded (FIG. 2C). For the individual stampers 101, these steps are repeated by shifting positions, and all the stampers 101 can be thermally attached to the endless belt 102 via the adhesive member 103. It should be noted that, as shown in FIG. 2D, the application of pressure to the laminated structure is performed by a rolling press mechanism 111 instead of the pressing mechanism 110, and all the members may be moved to sequentially fix multiple stampers 101. After all the stampers 101 have been securely fixed, the resultant structure is cured, for example, in an isothermal tank (not shown), within which the temperature has been increased to a temperature for setting the thermosetting resin 105. As a result, the belt-shaped mold 100 is obtained.

Figure 3A:
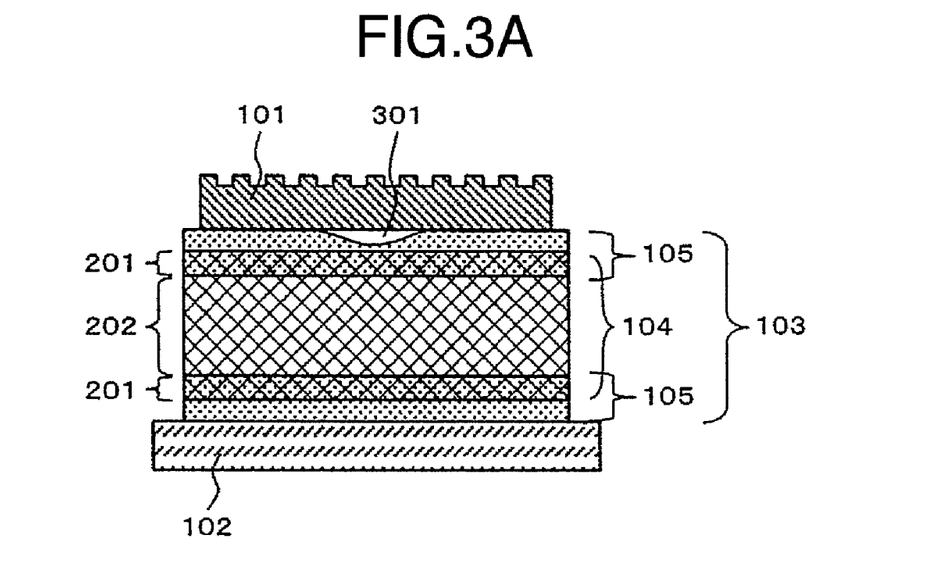
FIGS. 3A and 3B are schematic cross-sectional views for explaining, for comparison, the effects provided by an adhesive member used for manufacturing the belt-shaped mold of the present invention.
Figure 3B:
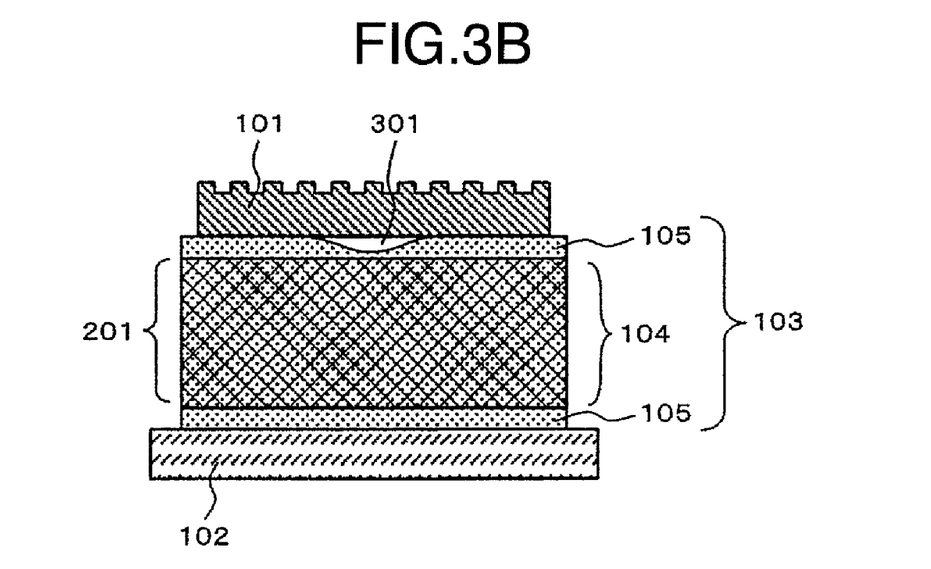

The effects provided by the adhesive member 103 of the first embodiment of the invention will now be described. FIGS. 3A and 3B are schematic cross-sectional views for explaining, for comparison, the effects of the adhesive member 103 during the manufacture of the belt-shaped mold 100 of this embodiment. The cross sectional views in FIGS. 3A and 3B show the structures immediately before the individual members are thermally bonded, and the state wherein the external air has been drawn from between the stampers 101 and the thermosetting resin 105, and, as a result, there is a void 301 in the thermosetting resin 105.

In a case wherein a void 301 remains in the belt-shaped mold after the thermal bonding and thermosetting process have been performed, pattern transfer accuracy is adversely affected, e.g., the stamper surface near the void is expanded and the pattern transfer face is warped. Therefore, during the thermal bonding process, for example, the void should be discharged, removed by any means. For a case, as shown in FIG. 3A, wherein there are porous areas 202 inside the porous member 104, since the thermosetting resin 105 becomes soft during the thermal bonding process, the void 301 can easily flow within the thermosetting resin 105. At such a time, when the porous area 202 connected to the external area that (e.g., is air permeable) is located near the void 301, the void 301 can be removed, through the porous area 202, and discharged externally. On the other hand, for a case wherein, as shown in FIG. 3B, the interior of the porous member 104 has filled with the thermosetting resin 105 and no porous area is available the void 301 must be moved to the end of the stamper 101 to be discharged, and removing it is difficult. That is, as in this embodiment, it is preferable that the adhesive member 103 have internal porous areas 202 that have not been impregnated with the thermosetting resin 105.

As another advantage provided for this case, since in this embodiment the porous areas 202 are provided inside the adhesive member 103, the porous areas 202 also serve as cushions in a case wherein a material to which a pattern is to be transferred has a rough surface or is unevenly thick. Therefore, the stampers 101 can be pressed along the surface of the transfer targeted material, and a pattern can be uniformly transferred. In addition to polytetrafluoroethylene, the material used for the porous member 104 can be polycarbonate, polyester, polyethylene, polypropylene, polyvinylidene fluoride, cellulose acetate, polysulfone, polyacrylonitrile polyamide or polyimide, or a compound of them. Especially when the material used has a lower elasticity modulus than has the stamper 101, and the endless belt 102 is employed, a greater cushioning effect is obtained.

The following effects are also obtained. Assume that a belt-shaped mold is formed simply by using a thermosetting resin to adhere the stampers 101 to the endless belt 102, and the mold is then attached to a nanoimprint system, which will be described later. When this nanoimprint system was driven, stress was applied to the adhered portion by the repetitive bending or stretching of the belt-shaped mold, and as a result, the adhered portion was damaged after only a couple of pattern transfer processes were completed. However, as in this embodiment, when the adhesive member 103 that has the porous areas 202 was employed, the adhered portion was not damaged when the pattern transfer process was repeated several tens of times. This is because the porous areas 202 are employed as stress relaxing layers, and the structure of this embodiment can effectively be employed to provide a durable belt-shaped mold.

Embodiment 2

According to a second embodiment of the present invention, the structure of an adhesive member 103 used for a belt-shaped mold 100 will be described in more detail. In the first embodiment, a description has been given on the assumption that the faces of the stampers 101 and the face of the endless belt 102 to be adhered to the adhesive member 103 are sufficiently smooth. However, when the faces of the stampers 101 and the endless belt 102 to adhere to the adhesive member 103 are rough (the surfaces are too uneven to ignore), an unexpected delamination phenomenon may occur due to insufficient adhesiveness with the adhesive member 103.

Figure 4A:
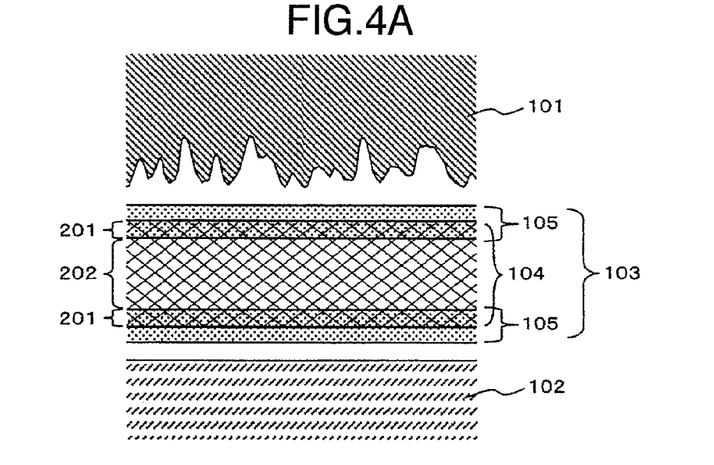
FIGS. 4A to 4C are schematic cross-sectional views for explaining the cause of a delamination phenomenon that occurs during the processing performed to manufacture the belt-shaped mold.
Figure 4B:
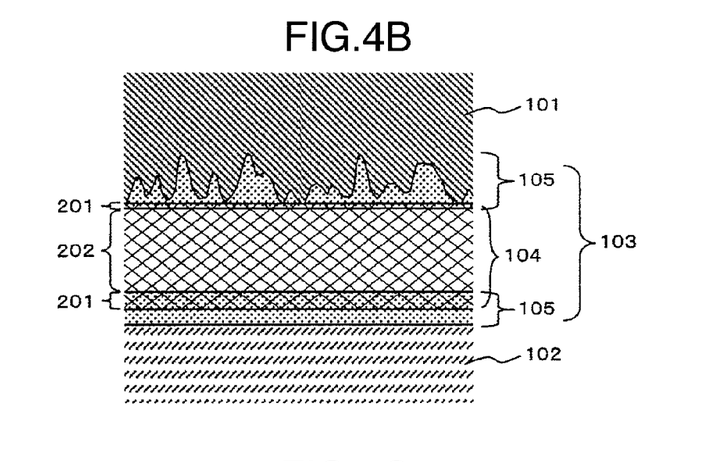
Figure 4C:
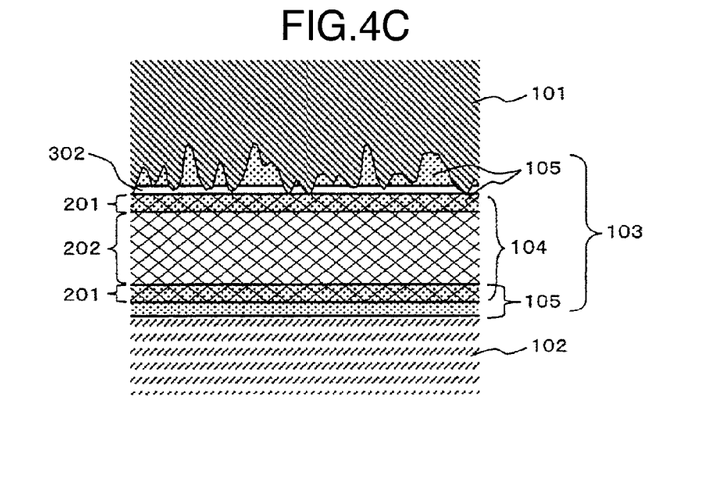

The cause of the delamination phenomenon is considered as follows. FIGS. 4A to 4C are schematic cross-sectional views for explaining the cause of the delamination phenomenon that occurs during the manufacture of the belt-shaped mold 100. In the structure illustrated in FIG. 4A, a thermosetting resin 105 is deposited that has the same thickness on either side of a porous member 104, and the depth of the convex-and-concave portions on the surface of the stamper 101 to adhere to the adhesive member 103 is equal to the thickness of the thermosetting resin 105. In this state, when the individual members, for example, are thermally bonded, the thermosetting resin 105 may move and fill the convex and concave portions in adhering surface of the stamper 101, as shown in FIG. 4B, and this may reduce the thickness of an impregnated areas 201 on the stamper 101 side. In this case, it is believed that since the adhesiveness between the thermosetting resin 105 and the porous member 104 was lowered, the delamination phenomenon occurred. Furthermore, as shown in FIG. 4C, the thermosetting resin 105 in the impregnated area 201 may not move toward the stamper 101, and only thermosetting resin 105 that is not included in the impregnated area 201 may fill the convex-and-concave portions in the adhering surface of the stamper 101. In this case, it is believed that the adhesiveness between the stamper 101 and the adhesive member 103 has been lowered because a gap 302 was formed between them, and the delamination phenomenon has occurred.

Figure 5A:
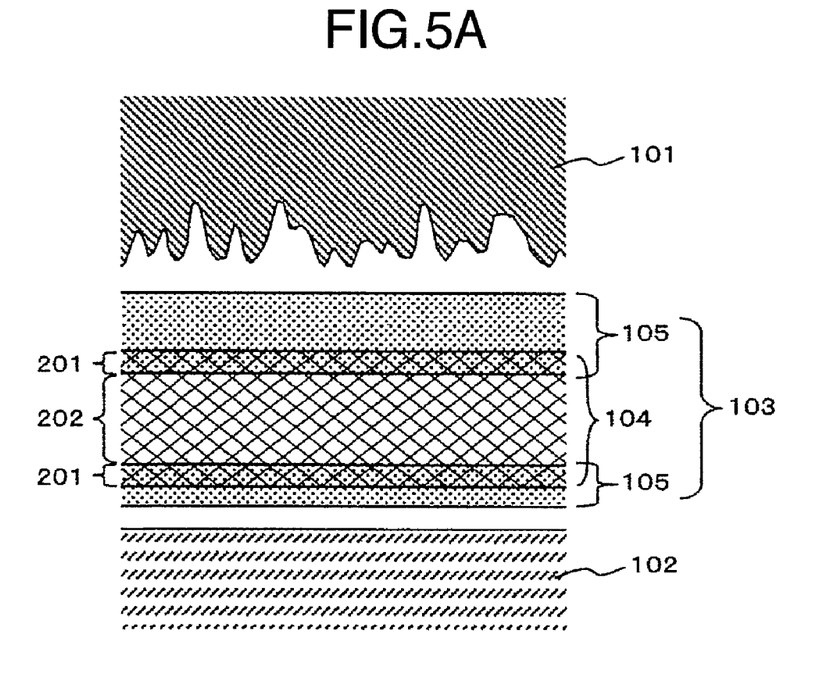
FIGS. 5A and 5B are schematic cross-sectional views for explaining the structural factor of the adhesive member used for manufacturing the belt-shaped mold of the present invention.
Figure 5B:
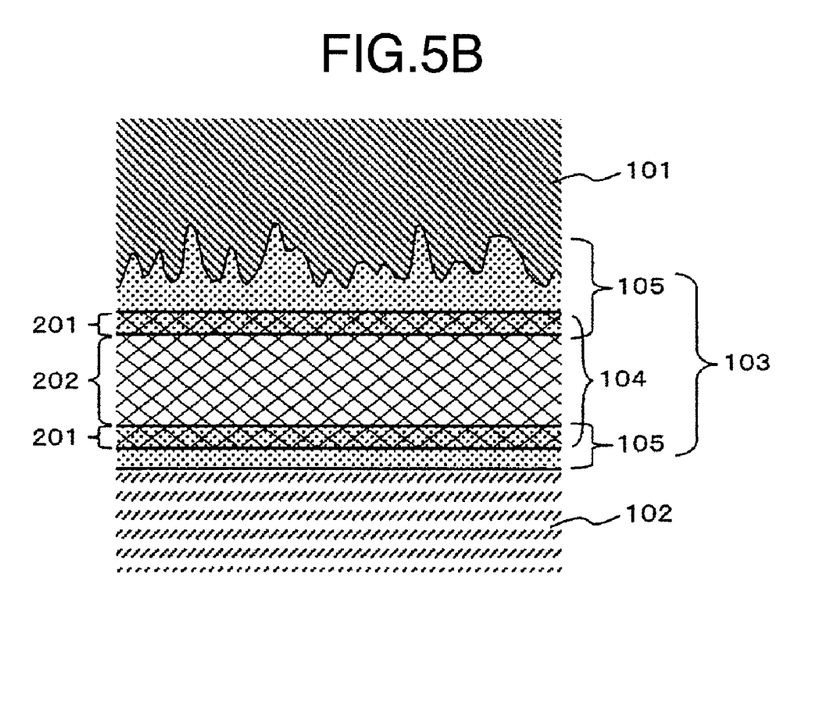

The structure for resolving the above described problem will now be described while referring to FIGS. 5A and 5B. FIGS. 5A and 5B are schematic cross-sectional views used to explain the structure factors of the adhesive member 103 used for manufacturing the belt-shaped mold 100 according to the second embodiment. As shown in FIG. 5A, the adhering face of the stamper 101 has greater convex-and-concave portions than the adhering face of the endless belt 102, i.e., the roughness average Ra for the stamper 101 is greater than that for the endless belt 102, and the thermosetting resin 105 layer deposited is thicker on the stamper 101 side than on the endless belt 102 side. Since thermosetting resin 105 that is not included in the impregnated area 201 on the stamper 101 side is provided and is sufficiently thick, as shown in FIG. 5B, reduction of the impregnated area 201 and the occurrence of a gap can be prevented. Further, the delamination phenomenon wherein the adhesive member 103 is separated from the stamper 101 or the endless belt 102 can be prevented.

Based on these results, a simple idea tends to be obtained such that, so long as a thick thermosetting resin 105 is deposited across the entire adhesive member 103, the problem presented by convex-and-concave portions in the adhering surface can be resolved. However, when a too thick layer of the thermosetting resin 105 is deposited, the thermosetting resin may be moved to the porous area 202 during a thermal bonding process, and overall, the porous member 104 may be changed to the impregnated area 201 (see FIG. 3B). Further, for a pattern transferring method that uses a belt-shaped mold, whereby a heat source, which contacts an endless belt, is employed to heat a stamper 101, when the thickness of the adhesive member 103 is increased, the heat resistance is increased and the heat efficiency reduced. Therefore, a problem is also encountered in controlling the transfer line speed. Thus, it is important that the thickness of the thermosetting resin 105 layer not be increased more than necessary, and that it be appropriate for the roughness of the adhering face, within a range for maintaining the adhesive strength.

Embodiment 3

Figure 6A:
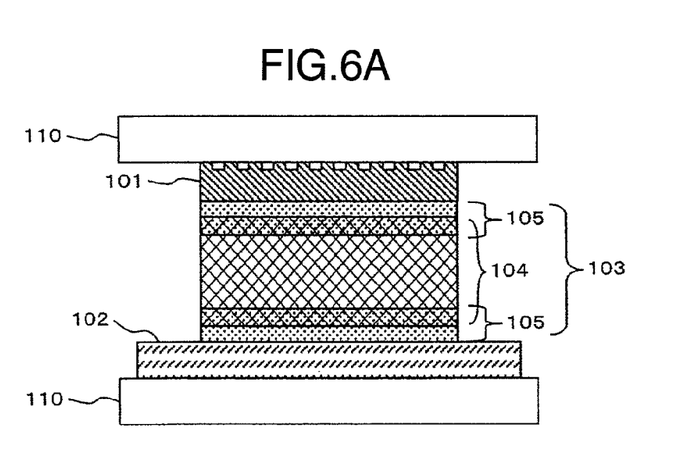
FIGS. 6A and 6B are schematic cross-sectional views for explaining another structural factor of the adhesive member used for manufacturing the belt-shaped mold of the present invention.
Figure 6B:
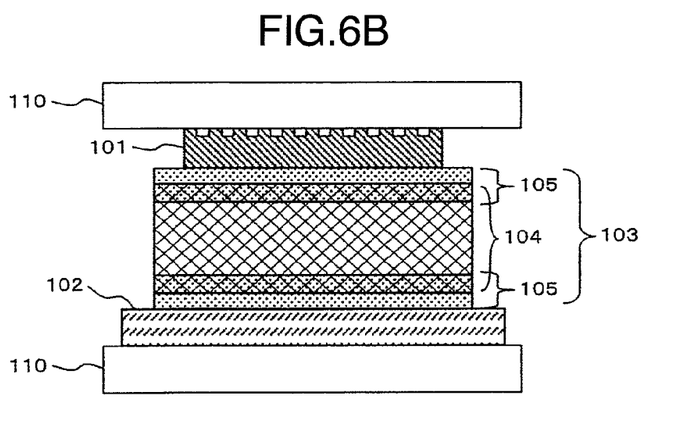

For a third embodiment of the present invention, a relationship is required between the sizes of an adhesive member 103 and each stamper 101 of a belt-shaped mold 100. FIGS. 6A and 6B are schematic cross-sectional views for explaining another structural factor applicable to the adhesive member 103 in the structure of the belt-shaped mold 100 of this embodiment. The structure in FIG. 6A is for a thermal bonding time in a case wherein the adhering face of the stamper 101 is the same size as is the adhesive member 103, and the structure in FIG. 6B is for a thermal bonding time in a case wherein the adhering face of the adhesive member 103 is larger than is the stamper 101. It should be noted that "size" represents the size of a projection face, and more specifically, represents the length, in the circumferential direction, of the endless belt 102 and the length in the direction of the width.

When a thermal bonding process was performed for the structures in FIGS. 6A and 6B, there was one case in which a delamination phenomenon occurred for the structure in FIG. 6A due to an insufficient adhesiveness between the end of the stamper 101 and the adhesive member 103. On the other hand, a delamination phenomenon did not occur between the end of the stamper 101 and the adhesive member 103.

The reason the different results were obtained for the two structures is believed to be as follows. In the structure in FIG. 6A, the adhesive member 103 is compressed by applying pressure to the stamper 101, and at this time, the ends of the adhesive member 103 are deformed toward the open side space. Therefore, a thermosetting resin 105 and the force of the pressure, which was to be applied to the stamper 101 and near the ends of the adhesive member 103, escaped to that space. Thus, it is felt that the adhesive strength between the stamper 101 and the adhesive member 103 was reduced, and that the delamination phenomenon occurred at the adhering faces. On the other hand, referring to the structure in FIG. 6B, since the adhesive member 103 is in an area larger than the stamper 101, the adhesive member 103 near the end of the stamper 101 is prevented from being deformed laterally. Therefore, since little of the force of the pressure escaped, it is believed that between the stamper 101 and the adhesive member 103 the adhesive strength was increased, and that on the adhering face the occurrence of the delamination phenomenon could be prevented.

In the processing for sequentially transferring a pattern using a belt-shaped mold, the mold release is sequentially performed, while a belt-shaped mold is bent by pulling up one end of a stamper that closely contacts a material to which a pattern is to be transferred. Therefore, when delamination has occurred at the stamper end (especially the end in the circumferential direction of the endless belt), the timing or the angle for the mold release may vary, and the material to which a pattern is to be transferred damaged. Further, the same problem is encountered when the adhesive member is smaller than the stamper. Therefore, it is preferable that a delamination phenomenon or a portion that has not yet been adhered not be located at the end of the stamper.

It should be noted that when a nanoimprint system is designed so that at an appropriately small angle the stamper is released from the material to which a pattern has been transferred, the difference in the mold release timing or the angle becomes relatively small, and damage to a material to which a pattern has been transferred may be reduced. However, when the angle at which the stamper is released from the material is quite small, this indicates that the distance until the release of mold has been completed is extended, and such a design is disadvantageous because the size of the nanoimprint system is increased. Therefore, in order to appropriately perform a pattern transfer using a belt-shaped mold, without increasing the size of the system, it is preferable that the ends of the stampers be securely fixed, and that they not be raised from the surface of the endless belt. That is, it is preferable that an adhesive member be employed whose adhering face is larger than the projection face (adhering face) of a stamper.

Embodiment 4

Figure 7:
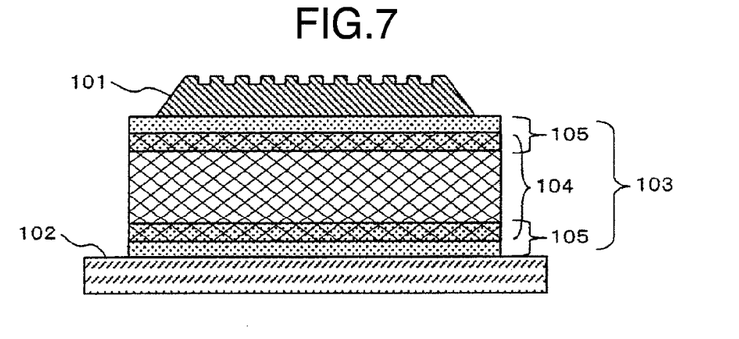
FIG. 7 is a schematic cross-sectional view for explaining the structural factor of a stamper for the belt-shaped mold of the present invention.

In a fourth embodiment of the present invention, the shape of a stamper 101 will now be described. FIG. 7 is a schematic cross-sectional view for explaining the structural factor of the stamper 101 for a belt-shaped mold 100 according to this embodiment. In the structure illustrated in FIG. 7, the vicinities at the ends of the stamper 101 are tapered, so that the face of the stamper 101 adhered to an adhesive member 103 is larger than the face of the stamper 101 on which a convex-and-concave pattern is formed.

The effects obtained by this structure, and the principle, are as follows. In a case wherein a great adhesive force is applied between the material to which a pattern is transferred and the face of the stamper 101 on which the convex-and-concave pattern is formed, and it is difficult for the belt-shaped mold 100 to be released from the material to which the pattern has been transferred, a tensile force is applied to the stamper 101 and the adhesive member 103 in a direction perpendicular to the adhering face. When the ends of the stamper 101 are not tapered (see, for example, FIG. 6B), the force applied to the ends of the stamper 101 on which the convex-and-concave pattern is formed is applied directly to the ends of the adhesive face 103, in a direction perpendicular to the adhering face. On the other hand, when the ends of the stamper 101 are tapered, the tensile force is applied to the ends of the stamper 101 on which the convex-and-concave pattern is formed, along the tapered face and obliquely, relative to the ends of the adhering face. The tensile force in the oblique direction can be divided into the horizontal/vertical components relative to the adhering face. That is, the component force in the vertical direction that separates the stamper 101 and the adhesive member 103 becomes smaller than the original tensile force (force in the oblique direction), so that it is difficult for the stamper 101 and the adhesive member 103 to be separated. Therefore, in order to prevent peeling of the ends of the stamper 101 during the pattern transfer process, it is preferable that the areas at the ends of the stamper 101 be tapered.

Embodiment 5

Figure 8A:
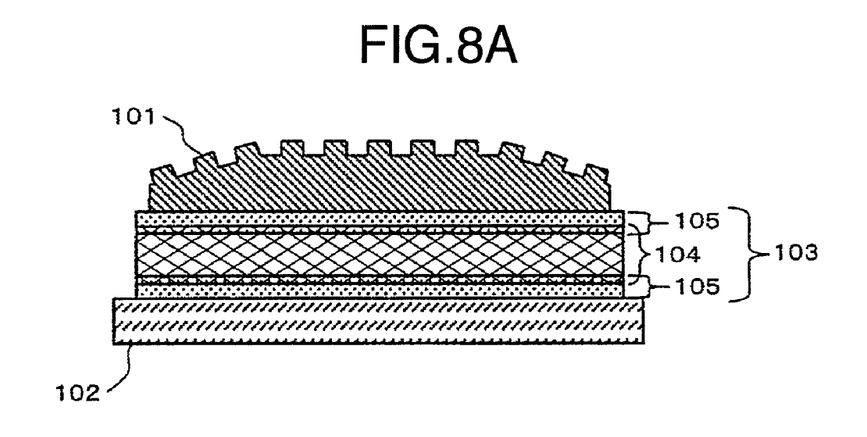
FIGS. 8A and 8B are schematic cross-sectional views for explaining another structural factor of the stamper for the belt-shaped mold of the present invention.
Figure 8B:
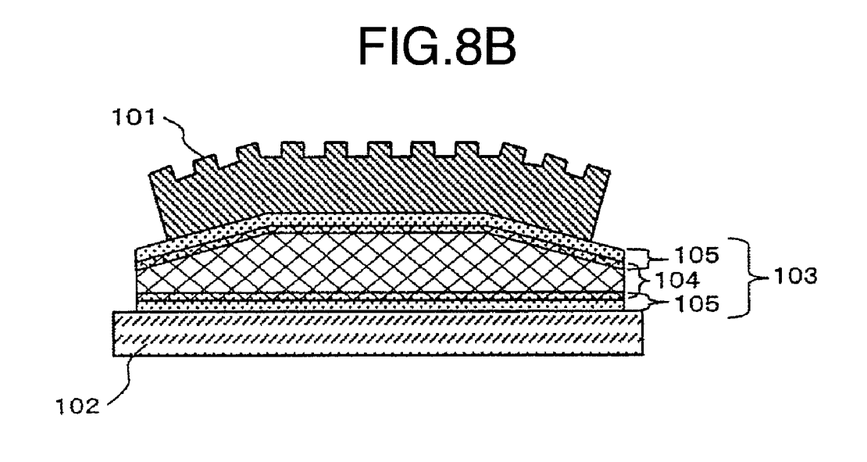

In a fifth embodiment of the present invention, a description will be given for structures for a stamper and an adhesive member that are appropriate for pattern transfer using a belt-shaped mold. FIGS. 8A and 8B are schematic cross-sectional views for explaining other structural factors for a stamper 101 and an adhesive member 103 for a belt-shaped mold 100 according to this embodiment. The structure of the belt-shaped mold 100 in FIG. 8A indicates that the thickness of the stamper 101 is reduced near the ends, and the structure of the belt-shaped mold 100 in FIG. 8B indicates that the thickness of the adhesive member 103 is reduced near the ends of the stamper 101. In either structure, a distance between the face of the adhesive member 103 adhered to the endless belt 102 and the surface of the stamper 101 is shorter near the ends of the stamper 101. In other words, the thickness of the belt-shaped mold 100 at the locations corresponding to the ends of the stamper 101 are reduced.

The effects obtained in this embodiment will now be described. When a pattern is to be transferred to a material larger than the stamper 101 that has been prepared for the belt-shaped mold 100, the ends of the stamper 101 tend to be stress raisers, and may cut deeply into the material, and further, the material may be deformed by the employment, as a fulcrum, of the portion into which the stamper 101 cuts (e.g., may be bent toward the space where the stamper 101 is not present). In such a case, the material to which the pattern is to be transferred may become thinner at positions corresponding to the ends of the stamper 101, and may, furthermore, be damaged or snapped. On the other hand, in this embodiment, since the thickness of the belt-shaped mold at positions corresponding to the ends of the stamper 101 is reduced, extra pressure applied to the ends of the stamper 101 can be reduced during the pattern transfer process. As a result, cutting into the material to which a pattern is to be transferred can be suppressed, and damage to the material can be prevented.

It should be noted that the ends of the stamper 101 include the ends in the circumferential (longitudinal) direction of the endless belt and the ends in the direction of the width. In addition, the ends of the stamper may be regarded as the peripheral edges of the stamper.

Embodiment 6

Figure 9A:
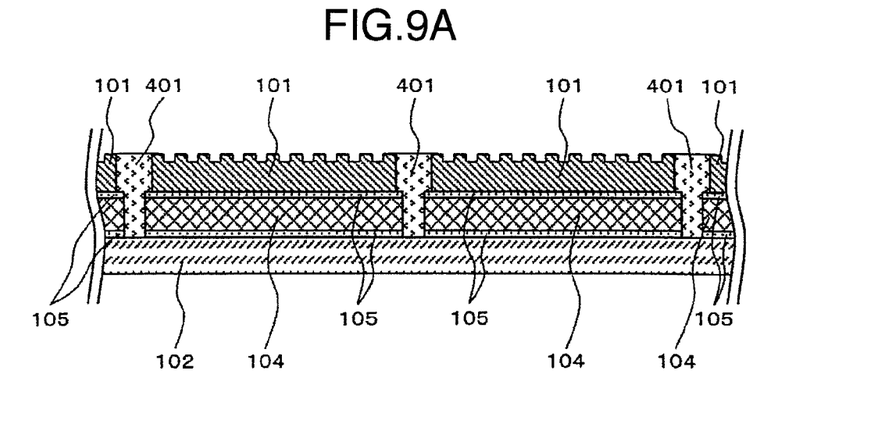
FIGS. 9A and 9B are schematic cross-sectional views for explaining the structural factor of the periphery of the stamper for the belt-shaped mold of the present invention.
Figure 9B:
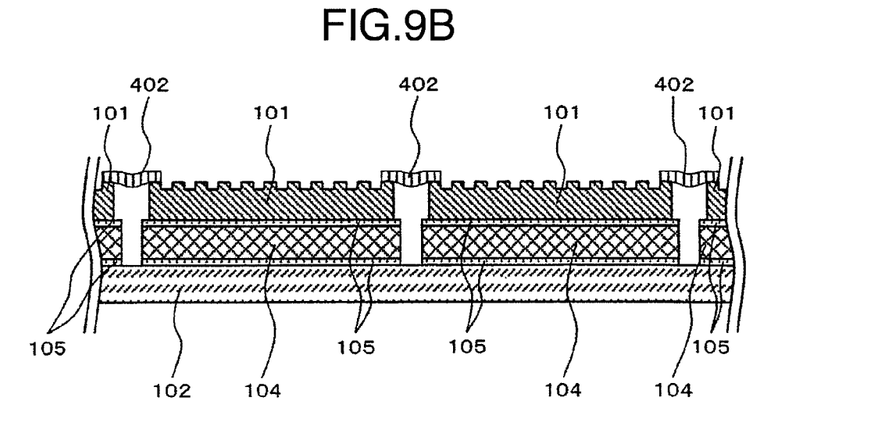

In a sixth embodiment of the present invention, the structure for the periphery of a stamper used for a belt-shaped mold will be described. FIGS. 9A and 9B are schematic cross-sectional views for explaining the structural factor of the periphery of the stampers 101 used for a belt-shaped mold 100 in this embodiment. The structure of the belt-shaped mold 100 in FIG. 9A represents a case wherein a spacer 401 made of silicon rubber is used to fill in gaps between the adjacent stampers 101. The structure of the belt-shaped mold 100 in FIG. 9B represents a case wherein a spacer 402 made of polyimide is applied across gaps between the adjacent stampers 101 to connect the ends of the faces of the stampers 101, on which a convex-and-concave pattern is formed.

The effects obtained in this embodiment will now be described. When the dimensions of a material to which a pattern is to be sequentially transferred exceed the dimensions of each stamper 101, and when the stampers 101 are arranged with a gap between them, the material pressed down by the periphery of the stampers 101 tends to enter the gaps between adjacent stampers 101, and a thick portion is frequently formed on the material. Furthermore, as previously described, the ends of each stamper frequently become locations at which stress is concentrated, and cut deeply into the material to which a pattern is to be transferred. In other words, the faces of the stampers 101 on which the convex-and-concave pattern is formed tend to be thin at their ends. Such a difference in thickness has an adverse affects, especially when a thin sheet is employed as the material to which a pattern is to be transferred. The strength of the sheet can become off balanced, and a sheet fracture may occur.

On the other hand, according to the sixth embodiment, as shown in FIGS. 9A and 9B, the spacers 401 and 402 are provided at the gaps between the adjacent stampers 101, to prevent the entry, into the gaps, of the material to which a pattern is to be transferred. With these arrangements, however, this problem can be avoided. In this embodiment, silicon rubber or polyimide is employed as example spacers; however, the material available for this use is not limited to these two, so long as the material does not become particularly deteriorated under the pattern transfer conditions encountered when using a belt-shaped mold. In addition, instead of employing the arrangements shown in FIGS. 9A and 9B separately, it is possible for the gaps to be filled with spacers 401 and then covered with spacers 402.

Embodiment 7

Figure 10A:
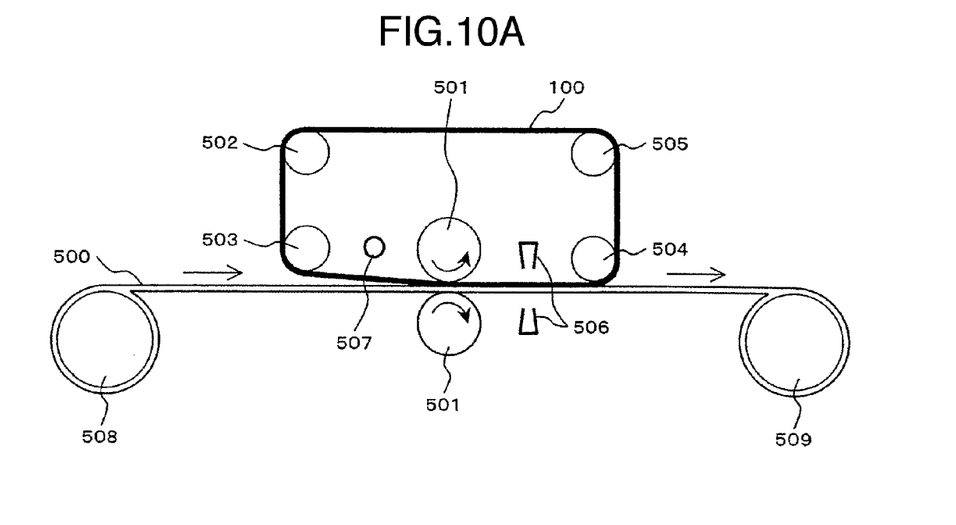
FIGS. 10A and 10B are schematic diagrams illustrating an example arrangement of a nanoimprint system, according to the present invention, that transfers a pattern to one side of a transfer targeted material.
Figure 10B:
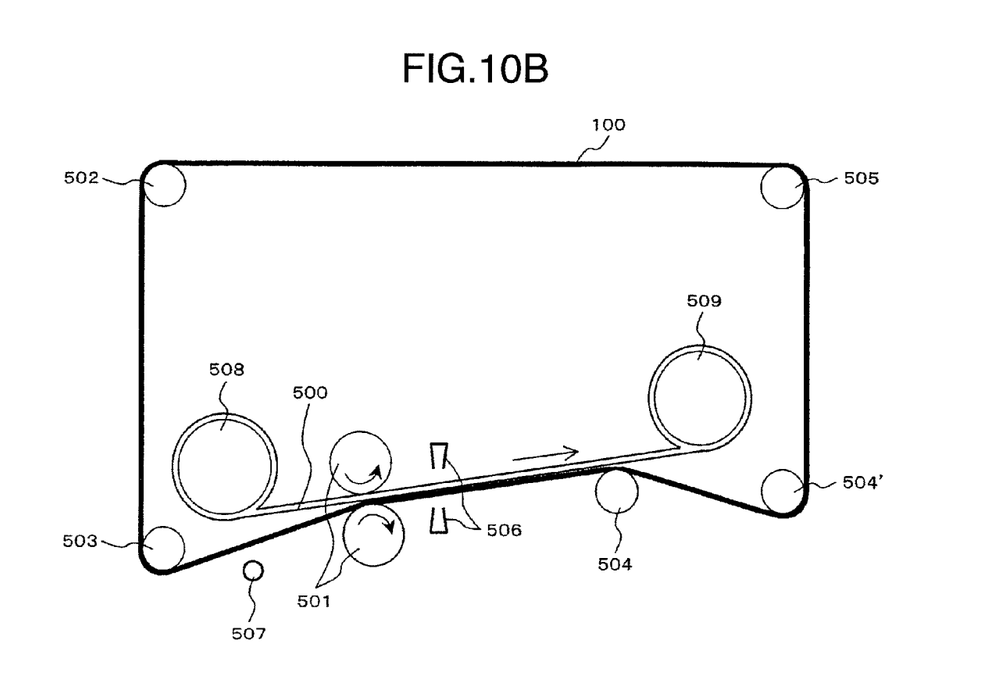

For a seventh embodiment of the present invention, the configuration of a nanoimprint system that employs a belt-shaped mold will now be described. FIGS. 10A and 10B are schematic diagrams illustrating example configurations for a nanoimprint system of this embodiment that is used to transfer a pattern to one side of a material. Referring to FIG. 10A for this embodiment, a belt-shaped mold 100 is arranged so as to pass between pressure rolls 501 while contacting the outer walls of drive rolls 502, 503, 504 and 505. A resin sheet 500, which is a material to which a pattern is to be transferred, is made, for example, of polystyrene. A roll of the resin sheet 500 is prepared in advance and is fitted over a sheet supply reel 508, and as the processing proceeds, the resin sheet 500 is extracted from the roll and is passed between the pressure roll 501, with the belt-shaped mold 100, and is wound around a sheet takeup reel 509. A modification is illustrated in FIG. 10B, wherein the sheet supply reel 508, the sheet takeup reel 509 and the resin sheet 500 are arranged inside the belt-shaped mold 100. Stampers are attached inside the belt-shaped mold 100, and with this arrangement, since drive rolls 502, 503, 505 and 510 are located on the same side as the stampers, it is feared that the surfaces of the stampers may be scratched by friction where they contact the drive rolls. In order to avoid this, the surfaces of the drive rolls may be shaped so as to avoid contact with the surfaces of the stampers, or they be covered with a soft material, so that it is difficult for the surfaces of the stampers to be scratched, even when they contact the drive rolls.

The pattern transfer processing is performed in the following manner. First, the pressure rolls 501 are heated, so that the surface temperature of the stampers of the belt-shaped mold 100 is equal to or higher than the glass transition temperature of the resin sheet 500. A heat lamp 507 and/or internal heaters (not shown) in the pressure rolls 501 can be employed to heat the pressure rolls 501.

Sequentially, the heated pressure rolls 501 are rotated at a predetermined velocity, while at the same time pressing the belt-shaped mold 100 and the resin sheet 500 together, so that a convex-and-concave pattern formed on the surface of the belt-shaped mold (stamper) is transferred to the resin sheet 500. Thereafter, the belt-shaped mold 100 and the resin sheet 500 are moved from the location where they are pressed together by the pressure rolls 501, and are cooled, for example, by air blowers 506. After the temperature of the resin sheet 500 has been reduced to the glass transition temperature or lower, the belt-shaped mold 100 and the resin sheet 500 are separated at the location of the drive roll 504. It should be noted that the heating method and the cooling method are not limited to those described above.

Figure 11:
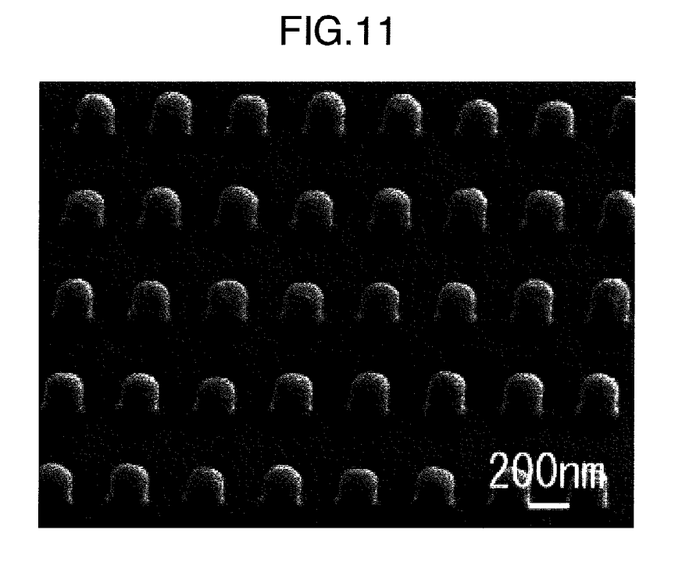
FIG. 11 is a diagram illustrating the SEM observation image of the surface of a pattern transfer sheet obtained by the nanoimprint system of the present invention.

The belt-shaped mold 100 in the seventh embodiment and the nanoimprint system shown in FIG. 10A were employed, and a fine pattern was transferred to a polystyrene sheet. FIG. 11 is a diagram illustrating a SEM observation image of the surface of a transfer sheet fabricated using the nanoimprint system of the seventh embodiment. Referring to FIG. 11, a fine pattern having a width of 200 nm, a height of 280 nm and a high aspect ratio of 1.4 could be transferred.

Figure 12:
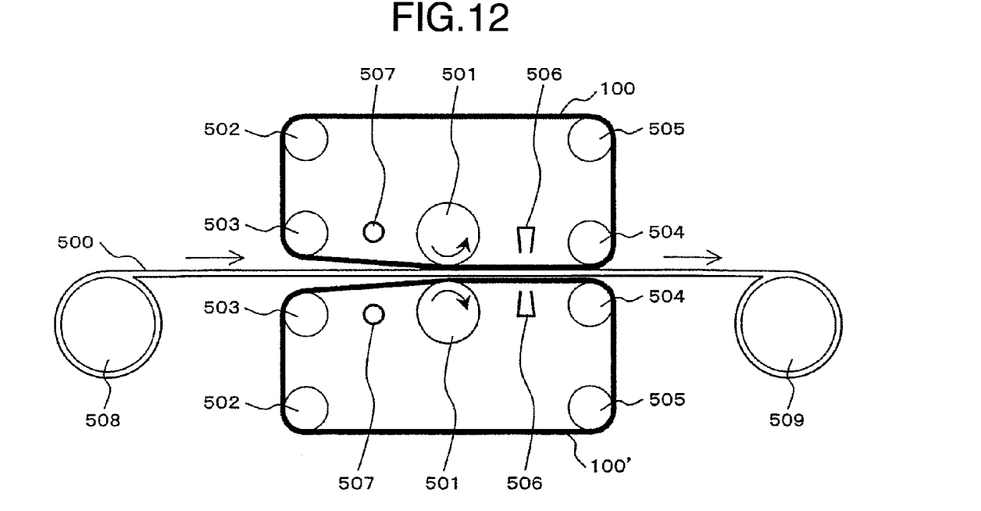
FIG. 12 is a schematic diagram illustrating an example arrangement of a nanoimprint system, according to the present invention, that transfers a pattern on both sides of a transfer targeted material.

FIG. 12 is a schematic diagram illustrating an example configuration of a nanoimprint system for the seventh embodiment used to transfer a pattern to both sides of a material. As shown in FIG. 12, since belt-shaped molds 100 and 100' and drive rolls are arranged on either side of the resin sheet 500, a fine pattern can be transferred to both sides of the resin sheet 500. It should be noted that fine patterns formed on the belt-shaped mold 100 and 100' may be identical or may differ. Furthermore, it is preferable that the belt-shaped molds 100 and 100' and the resin sheet 500 be preheated using the heat lamp 507 before these components are mounted on the pressure rolls 501. In addition, it is preferable that, as in the previous configurations, heaters be incorporated in the pressure rolls 501, and it is also preferable that, after the belt-shaped molds 100 and 100' and the resin sheet 500 have been mounted and are held by the pressure rolls 501, that the air blowers 506 be used to cool them.

Figure 13:
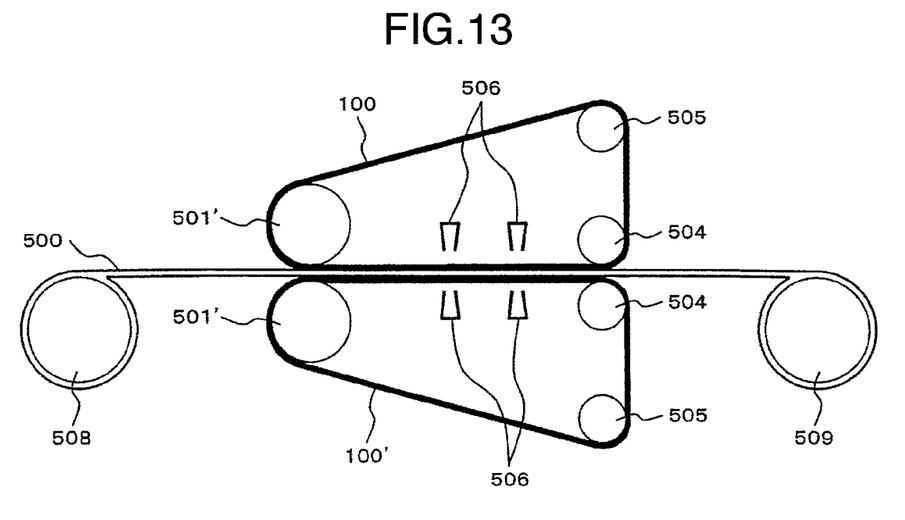
FIG. 13 is a schematic diagram illustrating another example arrangement for the nanoimprint system, according to the present invention, that transfers a pattern on both sides of a transfer targeted material.

FIG. 13 is a schematic diagram illustrating another configuration for the nanoimprint system of the seventh embodiment for transferring a pattern to both sides of a material. As shown in FIG. 13, since the belt-shaped molds 100 and 100' are arranged so they may be mounted around pressure rolls 501' having incorporated heaters, the heating efficiency of the belt-shaped molds 100 and 100' can be improved, and the rotational velocity (the line velocity) of the belt-shaped molds 100 and 100' can be increased. Although not shown, a heat lamp may be provided to heat the resin sheet 50, which is a material to which patterns are to be transferred.

ADVANTAGES OF THE EMBODIMENTS

The embodiments of the present invention provide the following advantages.

(1) According to the present invention, since the adhesive member of the belt-shaped mold internally includes a porous area that is not impregnated with a thermosetting resin, a void inside the belt-shaped mold can be quickly discharged when the stampers are thermally bonded to the adhesive member. Therefore, a belt-shaped mold can be provided with which a pattern transfer can be accurately performed.

(2) According to the invention, the adhesive member of the belt-shaped mold includes an adhesive layer that has a thickness consonant with the roughness average of the face of a member to be adhered, such as a belt-shaped support member or a stamper. Therefore, the reduction in size of the impregnated area of the adhesive member and the occurrence of a gap can be prevented, and delamination between the stamper or the belt-shaped support member and the adhesive member can be prevented.

(3) According to the belt-shaped mold of the invention, since the adhering face of an adhesive member is larger than the projection face (the adhering face) of the stamper, the escape of the pressure applied during thermal bonding is reduced. Therefore, the adhesiveness between the stamper and the adhesive member is increased, and the occurrence on the adhering face of a delamination phenomenon can be prevented.

(4) According to the belt-shaped mold of the invention, since the portions at the ends of the stamper are tapered, the vertical component force required to separate the stamper from the adhesive member is lowered, and the occurrence of a delamination phenomenon for the stamper can be suppressed during the pattern transfer process.

(5) According to the invention, since the belt-shaped mold is formed so it is thin at the locations corresponding to the ends of the stampers, during the pattern transfer process cutting into the resin material is prevented and damage to the material can be prevented.

(6) According to the belt-shaped mold of the invention, since spacers are provided at the gaps between the stampers, the material to which the pattern is to be transferred is prevented from entering the gaps during the pattern transfer process. As a result, damage to the material can be prevented.

(7) According to the invention, the nanoimprint system can transfer a fine pattern having a high aspect ratio, and can perform a sequential pattern transfer using a belt-shaped mold. Thus, a high-performance device that requires a fine structure having a high aspect ratio can be manufactured with a high throughput.

It will be further understood by those skilled in the art that the foregoing description has been made on embodiments of the invention and that various changes and modifications may be made in the invention without departing from the spirit of the invention and scope the appended claims.

The invention claimed is:

1. A nanoimprint mold comprising:
   a belt-shaped support member;
   a plurality of stampers, for each of which a fine convex-and-concave pattern, to be transferred, is formed on one surface; and
   an adhesive member, to which the belt-shaped support member and the stampers are to be securely adhered,
   wherein the adhesive member includes a porous member and adhesive layers, which are deposited on either face of the porous member, for impregnating one part of the porous member, and
   wherein, for the porous member, a porous area that is not impregnated with the adhesive layers, is provided and positioned so as to sandwich the porous member between portions impregnated with the adhesive layers.

2. A belt-shaped mold according to claim 1, wherein the stampers are connected to a surface of an outer wall of the belt-shaped support member; and wherein the fine, convex-and-concave pattern faces outward.

3. A belt-shaped mold according to claim 1, wherein the porous member is air-permeable.

4. A belt-shaped mold according to claim 1, wherein the porous member is made of a resin.

5. A belt-shaped mold according to claim 4, wherein the resin contains PTFE (polytetrafluoroethylene).

6. A belt-shaped mold according to claim 1, wherein the adhesive layers are formed of a thermosetting resin.

7. A belt-shaped mold according to claim 1, wherein thicknesses of the adhesive layers differ for either face of the adhesive member; and one of the adhesive layers that is applied to a face of either the belt-shaped support member or the stamper, for which roughness average Ra is greater, is thicker than the other adhesive layer applied to a face of the other.

8. A belt-shaped mold according to claim 1, wherein a projection size for an adhering face of each of the stampers is smaller than that of an adhering face for the adhesive member.

9. A nanoimprint mold comprising:
   a belt-shaped support member;
   a plurality of stampers, for each of which a fine convex-and-concave pattern, to be transferred, is formed on one surface; and
   an adhesive member, to which the belt-shaped support member and the stampers are to be securely adhered,
   wherein the adhesive member includes a porous member and adhesive layers, which are deposited on either face of the porous member, for impregnating one part of the porous member,
   wherein, for the porous member, a porous area that is not impregnated with the adhesive layers, is provided and positioned so the porous member is sandwiched between portions impregnated with the adhesive layers, and
   wherein, viewed in a direction parallel to a plane along which the adhesive member and the stampers are adhered, portions of the belt-shaped mold corresponding to the ends of the stampers are thinner than are portions of the belt-shaped mold at locations corresponding to the centers of the stampers.

10. A belt-shaped mold according to claim 9, wherein, viewed in a direction parallel to a plane along which the adhesive member and the stampers are adhered, portions of the adhesive member corresponding to the ends of the stampers are thinner than those at locations corresponding to the centers of the stampers.

11. A belt-shaped mold according to claim 9, wherein, viewed in a direction parallel to a plane along which the adhesive member and the stampers are adhered, portions at the ends of the stampers are thinner than portions at the centers of the stampers.

12. A belt-shaped mold according to claim 11, wherein, viewed in a direction parallel to a plane where the adhesive member and the stampers are adhered, a cross-sectional shape of end areas of the stampers is tapered.

13. A belt-shaped mold according to claim 1, wherein a resin material is used to fill gaps between adjacent stampers, of the plurality of stampers that are arranged along the surface of the belt-shaped support member.

14. A belt-shaped mold according to claim 1, wherein a tape-like material is applied to the surface of adjacent stampers, of the plurality of stampers arranged along the surface of the belt-shaped support member, so as to be extended across gaps between the adjacent stampers.

15. A nanoimprint system comprising:
   a belt-shaped mold as defined in claim 1;
   a belt-shaped mold drive mechanism for rotating the belt-shaped mold;
   a conveying mechanism for conveying a transfer targeted member, to which a fine, convex-and-concave pattern, formed on stamper surfaces, is to be transferred; and
   a pattern transfer mechanism for gripping the belt-shaped mold and the transfer targeted member, and for transferring the fine, convex-and-concave pattern from the stamper surfaces to the surface of the transfer targeted member.

* * * * *